(12) United States Patent
Keller et al.

(10) Patent No.: US 7,381,986 B2
(45) Date of Patent: Jun. 3, 2008

(54) ARRANGEMENT FOR TESTING SEMICONDUCTOR CHIPS WHILE INCORPORATED ON A SEMICONDUCTOR WAFER

(75) Inventors: Brion L. Keller, Binghamton, NY (US); Bernd K. F. Koenermann, San Jose, CA (US); David E. Lackey, Jericho, VT (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 11/477,963

(22) Filed: Jun. 28, 2006

(65) Prior Publication Data

US 2006/0284174 A1 Dec. 21, 2006

Related U.S. Application Data

(62) Division of application No. 10/248,380, filed on Jan. 15, 2003, now abandoned.

(51) Int. Cl.
*H01L 23/58* (2006.01)

(52) U.S. Cl. ............................................. 257/48

(58) Field of Classification Search .................. 257/48, 257/620, 692, E21.524; 361/53, 201
See application file for complete search history.

(56) References Cited

U.S. PATENT DOCUMENTS

| | | | | |
|---|---|---|---|---|
| 5,903,489 A | * | 5/1999 | Hayano | 365/51 |
| 6,121,677 A | * | 9/2000 | Song et al. | 257/692 |
| 6,127,694 A | * | 10/2000 | Nakajima | 257/48 |
| 6,127,729 A | * | 10/2000 | Fukuda | 257/736 |
| 6,133,054 A | * | 10/2000 | Henson | 438/17 |
| 6,194,739 B1 | * | 2/2001 | Ivanov et al. | 257/48 |
| 6,228,684 B1 | * | 5/2001 | Maruyama | 438/113 |
| 2002/0070429 A1 | * | 6/2002 | Wester | 257/620 |
| 2002/0190357 A1 | * | 12/2002 | Kosugi et al. | 257/669 |

* cited by examiner

*Primary Examiner*—Nathan W Ha
(74) *Attorney, Agent, or Firm*—Francis J. Thornton

(57) ABSTRACT

An arrangement that will provide multiple communication paths for the simultaneously testing of a plurality of un-diced chips on a semiconductor wafer that will simultaneously permit each such communication path to service more than one chip while using a minimum number of tester contacts. These and other objects, features and advantages of the present invention are accomplished in a semiconductor wafer having thereon a number of kerf isolated integrated chips, each of said chips being coupled to at least two different ones of strategically placed administration circuits via two different stimulus buses; each chip being coupled to each administration circuit via selection control circuits laid down in the kerf area between the chips. It is this redundancy that significantly reduces the possibility of failure associated administration or selection control circuits. The stimulus busses can also be used to provide each chip with parallel serial scan data as well as power and other signals such as clock and enable and disable signals. Each chip control circuit provides the chip with power, bus clock, control, enable and response lines, can also connected to each chip via suitable lines in the kerfs.

8 Claims, 2 Drawing Sheets

ARRANGEMENT FOR TESTING SEMICONDUCTOR CHIPS WHILE INCORPORATED ON A SEMICONDUCTOR WAFER

This is a division of Ser. No. 10/248,380 filed Jan. 15, 2003 now abandoned.

BACKGROUND OF THE INVENTION

1. Field of the Invention

This invention relates generally to the testing of un-diced semiconductor chips in wafer form. More particularly the present invention is directed to an arrangement that will provide for the testing of a plurality of such un-diced chips on a semiconductor wafer while using a minimum number of tester interfaces or contacts while simultaneously providing at least two communication paths coupling each such un-diced chip to two different tester interfaces.

2. Background of the Invention

In a typical semiconductor wafer, a plurality of integrated circuits is formed therein as individual blocks or chips which are electrically separated from one another by suitable dicing paths or kerfs lying between adjacent chips. Once the chips are formed in the wafer and while they still are in situ on the wafer, they are tested to determine which are functional and which are not. After testing the wafers are cut into individual chips by cutting the wafer along the dicing paths or kerfs. Any one of a variety of dicing techniques generally known to the art can be used. Once so separated each good chip is then packaged and sold and any failing chips are discarded.

In one present day testing procedure, a tester having a set of probes identical with the set of contact pads on each chip is individually placed in contact with the pads on a single chip, the chip is tested and then the tester probes are removed from the tested chip and moved to an adjacent chip that is to be tested. Because each chip must be individually probed, this procedure is difficult and time consuming.

To avoid the costs of individually probing and testing each chip as above described, large specialized testers capable of probing and collecting data from several chips simultaneously were developed. As might be expected, the complexity of these machines has increased proportional to the size and complexity of the chips to be tested thus increasing the cost and complexity of the test procedures. Also, the number of chips that may be tested simultaneously with such machines is limited by the size and number of the probes necessary to contact the chips being tested.

In a first attempt to overcome such problems, surface wiring, that would contact each chip so that data could be extracted therefrom, either was deposited in the kerf between the chips or formed on an insulated overlay that can be placed atop the chips. However, as the size of the wafers increased the number and size of the chips became proportionally greater and the number, length, extent and reliability of these wiring or communication paths existing between the tester and each of the chips to be tested became not only still more complex and more prone to failure but the power and cooling requirements also increased. To alleviate these problems, each chip to be tested was then provided with a portion of the required test logic and arranged in sets with each set provided with a respective BIST (built in self test) engine. This solution however increased the wiring density in the kerfs between the sets and further complicated the electrical circuitry of each chip and thus further increased the probability of chip failure while simultaneously causing the size of each chip to be correspondingly enlarged. This resulted in a reduction in the number of chips that can be formed on each wafer. Still further, because this approach requires that the data be extracted serially from each chip through the deposited wiring, not only is the required test time extended but any defects in the wiring or in the added circuitry caused good chips to be erroneously identified as failures.

SUMMARY OF THE INVENTION

It is an object of the present invention to avoid all these prior art problems. The present invention does so by providing, on the wafer, a selected number of tester interface circuits and coupling each chip formed in said wafer to two different tester interface circuits via two different distinct wiring arrangements. This assures that each chip on the wafer can be positively and efficiently tested without including, in each chip to be tested, any portion of the required test logic while substantially eliminating the probability that an interface or wiring defect can result in the rejection of good chips. The present invention accomplishes this by providing, in the kerfs on the wafer, distinct wiring arrangements for coupling each chip to first and second interface test circuits. The present invention, in one embodiment, accomplishes this by providing, in each horizontal kerf on the wafer, a respective wiring arrangement that couples each chip in a respective row to a first respective interface test circuit and providing, in each vertical kerf, a respective wiring arrangement that couples each chip in a column to a second respective interface test circuit. Thus, each chip on the wafer is coupled to two different interface test circuits with different wiring arrangements. The present invention accomplishes this without increasing either the size or complexity of each chip or the number of busses in each kerf or the width of each kerf. The present invention thus assures that all chips on a wafer can be redundantly tested, via different and unique interface test circuits and different and unique test paths, such that each chip can be tested by two different interface circuits via unique test paths. This permits each chip to be positively tested during a single test sequence even if an interface circuit fails or if a wiring defect occurs in one or more of the test paths.

By having each chip on a wafer coupled to at least two different interface test circuits via distinct wiring arrangements a test path is always assured to each chip thus prevent chips from being erroneously indicated as failures because of defects in either the test wiring or the interface circuits.

It is a still further object of the invention to include in each wiring arrangement an administration circuit containing a built-in test engine that also serves as a test buffer and a last stage pipeline of a tester to allow multiple chips on the wafer to be tested in parallel.

It is an object of the present invention to reduce test costs for such costs can be reduced by eliminating the need of retesting failed chips after dicing.

It is an advantage of the invention that by strategically locating a number of interface test circuits on the wafer each chip can be coupled to at least two different interface test circuits thereby significantly reducing the chance that a failing interface test circuit or a failure in a portion of the kerf wiring will impact on the ability to test each chip.

A further advantage of the present invention is the reduction of the cost of testing achieved by simultaneously testing multiple chips on a wafer.

It is further advantage of the invention that a large number of chips on a wafer can be can be tested in parallel.

These and other objects, features and advantages of the present invention are accomplished in a semiconductor wafer having thereon a number of kerf isolated integrated chips, each of said chips being coupled to at least two different interface test circuits via two respective selection control circuits and two respective selected wiring paths; each of said wiring paths further comprising a plurality of distinct stimulus busses deposited in the kerf area between the chips. It is this redundancy that eliminates the possibility of testing errors due to failure of either an administration circuit, an open or defective bus, or a defective selection control circuit. The stimulus busses are used to provide each chip with power, parallel serial scan data and other inputs such as clock, control, chip enable and data enable signals as well as obtaining the chip response to such inputs.

BRIEF DESCRIPTION OF THE DRAWINGS

The foregoing and other objects, features and advantages of the invention will be apparent from the following detailed description of the invention as illustrated in the accompanying drawings in, in which.

DETAILED DESCRIPTION OF THE INVENTION

Figure 1:
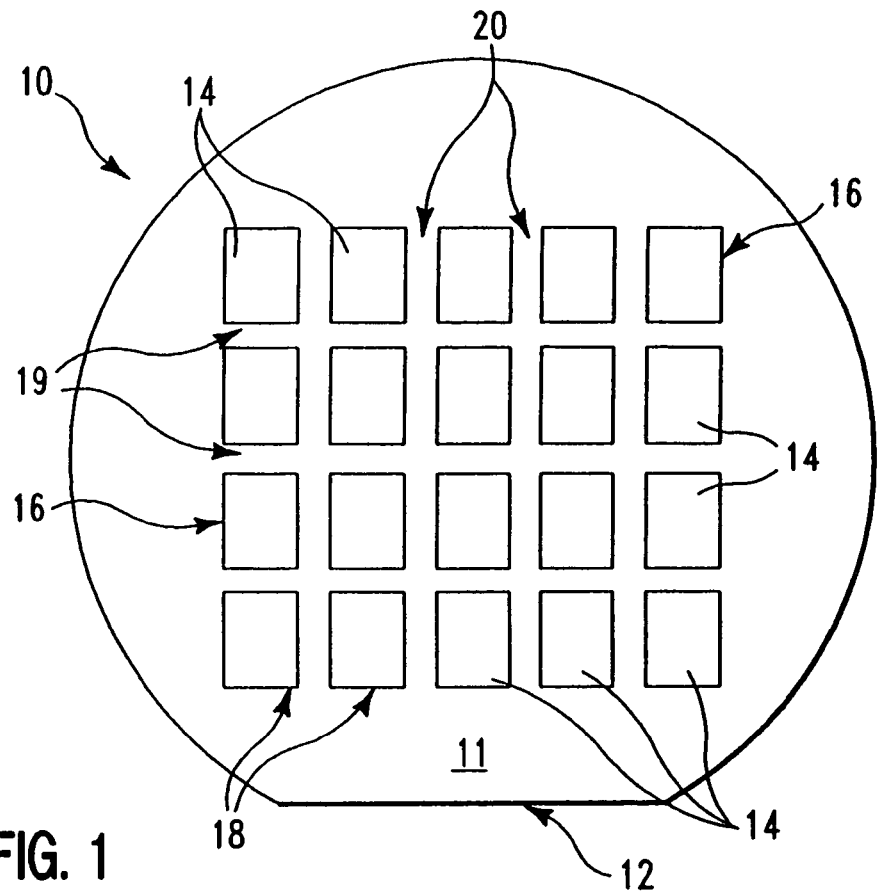
FIG. 1 is a top view of a typical semiconductor wafer having a plurality of chips formed therein.

Turning now to FIG. 1 there is shown a generally circular semiconductor wafer 10 typical of the prior art. This wafer has an upper surface 11 and a flat edge 12 and a plurality of integrated circuit chips 14 formed in said upper surface. Each of these circuit chips 14, as is well known to the art, comprise, for example, as memory circuits but may comprise any others type of circuit known to the semiconductor art. The chips 14 are generally arranged in the upper surface 11 as a series of parallel rows 16 and parallel columns 18. The rows 16 are arranged parallel to the flat edge 12 of the wafer 10 and are aligned with the chips, in adjacent rows, as to form the series of parallel columns 18 arranged perpendicular to the flat edge 12. Horizontal kerfs or dicing lanes 19 and vertical kerfs or dicing lanes 20 separate the respective rows 16 and columns 18. Thus the horizontal kerfs 19, separate the rows 16 and are also to parallel to the wafer flat 12, while the vertical kerfs 20, separate the columns 18 and are perpendicular to the wafer flat 12. The kerfs 19 and 20 thus form an orthogonal grid on the surface of the wafer. As the final step in the manufacturing process the chips are separated by cutting the kerfs using the so called dicing process well known to the semiconductor art.

Also, as known to the art, this regular arrangement of chips also permits each chip to be uniquely identified based on its location on the wafer.

Figure 2:
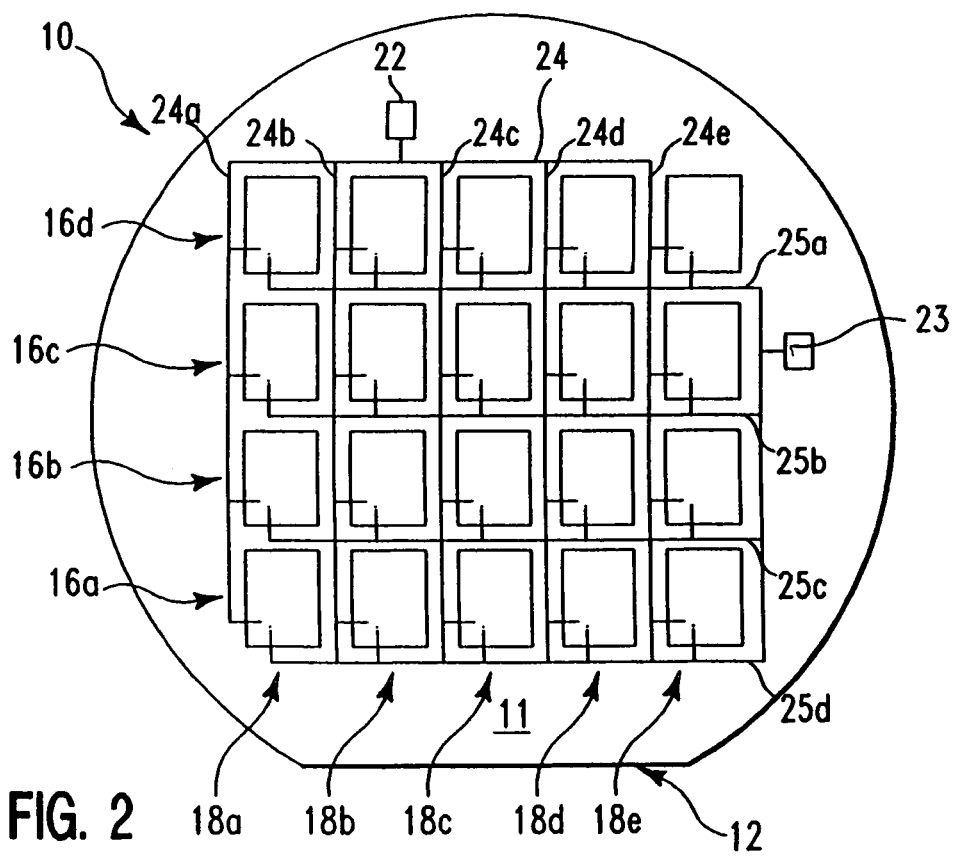
FIG. 2 is a top view of the semiconductor Wafer of FIG. 1 showing how two tester interface test circuits can each be coupled, via wiring paths in the kerf, to every chip on the wafer of FIG. 1.

FIG. 2 shows a top view of the semiconductor wafer 10 of the present invention illustrating how, in accordance with the present invention, there is positioned, around the periphery of the wafer at least two test interface circuits 22 and 23, each of which is connected, via respective wiring paths 24 and 25, to the circuitry formed in each chip on the wafer. Wiring path 24 is provided with a number of branches equal to the number of columns 18 and wiring path 25 is provided with a number of branches equal to the number of rows 16. As shown in FIG. 2 wiring path 24 has five branches 24a, 24b, 24c, 34d and 24e each of which is coupled to each chip in a respective adjacent column. Thus, branch 24a passes down the left side of column 18a and is coupled to the circuitry of each chip in column 18a, branch 24b passes down the kerf between columns 18a and 18b and is coupled to the circuitry of each chip in column 18b, branch 24c passes down the kerf between columns 18b and 18c and is coupled to the circuitry of each chip in column 18c, branch 24d passes down the kerf between columns 18c and 18d and is coupled to the circuitry of each chip in column 18d and branch 24e passes down the kerf between columns 18d and 18e and is coupled to the circuitry of each chip in column 18e. Similarly, FIG. 2 also shows the wiring path 24 having four branches 25a, 25b, 25c and 25d with branch 25a passing beneath the bottom row 19a and is coupled to each chip in row 19a, branch 25b passes down the kerf between rows 19a and 19b and is coupled to the circuitry of each chip in row 19b, branch 25c passes down the kerf between rows 19b and 19c and is coupled to the circuitry of each chip in row 19c and branch 25d passes down the kerf between rows 19c and 19d and is coupled to the circuitry of each chip in row 19d. In this way the circuitry of each chip is coupled via two different wiring paths to two different respective interface circuits.

Figure 3:
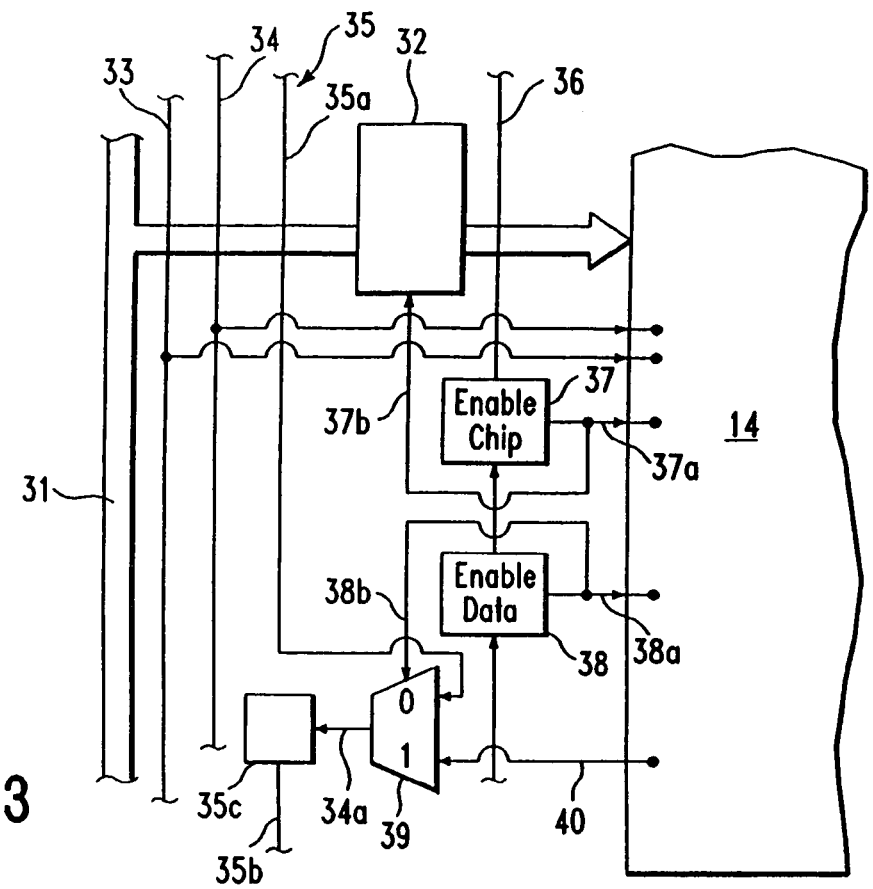
FIG. 3 shows in greater detail a wiring path laid down in the kerf together with the circuitry necessary to coupled information from the tester interface circuits to each chip in the wafer.

Turning now to FIG. 3 there will be described, in detail, the wiring paths and circuitry needed to couple the signals to and from the wiring paths into and out of a respective chip. As shown in FIG. 3, each wiring path includes a stimulus buss 31 having a plurality of signal paths, a clock line path 33 which may include a plurality of clock lines, a control signal line path 34 which may include a plurality of control signal lines, a segmented response chain path 35 comprised of inter chip segments 35a and 35b, and an enable chain 36. The stimulus buss 31 in each wiring path is respectively coupled to each respective chip 14 through a respective pass gate 32, similarly the enable chain path 36 is coupled to each respective chip 14 through a respective chip enable circuit 37 and a respective data enable circuit 38. Each respective chip enable circuit 37 has an output coupled to the respective chip 14 at node 37a and to the respective pass gate 32 via line 37b. Each respective data enable circuit 38 has an output coupled to the respective chip 14 at node 38a and to a MUX circuit 39 via line 38b. The MUX circuit 39 also has an output 39a coupled to response chain segment 35b through a latch 35c and two additional inputs. One these additional MUX inputs is coupled to the chip output node 40 and the other one these additional MUX inputs is coupled to segment 35a of the response chain 35. The MUX output 39a is fed into the response chain segment 35 through a latch 35c. The buss 31 is designed for supplying multiple (e.g., 32) parallel stimulus signals for use in sending parallel serial scan data into each chip under test and the enable chain 36 input on each chip can be driven by a control scan chain in the test bus. Preferably the signals on the stimulus buss 31 should contain a unique scan bit for each chip connected to that test bus. To keep the number of test bus signals as low as possible, the chips to be tested must implement a boundary scan arrangement such as the reduced pin-count test methodologies already known to the prior art and presently in use.

In cases where it is desirable to be able to disable chips, a disable signal can be sent to each chip by a control scan chain in the test bus. The control scan chain would contain a scan bit for each chip connected to that test bus. In some cases it may also be possible for one enable scan chain element to control multiple chips.

To minimize the amount of wiring in the test bus, all chips connected to the same test bus receive identical input control data. The outputs from each chip will need to be kept separate to allow determining which chips are good and which are bad. To minimize the size of the output or response chain, the chip outputs preferably are captured by the latch or shift register 39 located within the kerf. To minimize the length of this latch 39, the number of chip outputs needing to be monitored should be minimized to one or as close to one as is practical. This can be accomplished, if the chip internally compresses all responses into a signature and the signature is compared on-chip as well. By so doing only a single output is required from each chip being tested in parallel. More over, if the number of chips being tested in parallel is small (e.g., 32 or less), it is possible to avoid creation of an output observation scan chain and simply wire each chips signature compare output directly through the response chain back to the respective interface test circuit 23. In such cases, it may be necessary for chips to be enabled or disabled while the wiring path to which they are connected to is being used to test other chips. This technique reduces power and/or cooling requirements and can be accomplished by including a chip enabling scan chain within the test bus such that each chip can have supplied thereto an independent set enable signal without requiring a separate control signal within the kerf test bus for each chip. Note that the enable control bus can feed back into the response bus to aid in checking test bus functionality. Similarly, the stimulus bus could be sampled into the response chain to confirm continuity of the stimulus bus at various points (not shown).

Having a interface test circuit on the wafer allows some sophisticated testing logic to be incorporated into the test without having this logic consume space on each chip and without having to add this logic to a tester, increasing the cost of the tester. For example, the interface test circuit could contain enough memory to hold two weight sets, plus the logic needed to create weighted random patterns to be sent down the test bus for a Weighted Random Pattern Test generation capability. It could support the loading of one weight set into its memory from the tester while the previous weight set is being applied to the chips on the wafer.

Included in the data loaded for a weight set could be the expected on-product signature. The expected signature would be sent down the test bus for each chip under test to use for comparing with its own generated signature. The signature compare good signal will be captured in the output scan chain of the test bus and read back into the interface test circuit for processing.

This approach also works for more traditional stored pattern testing. The interface test circuit can support receiving data for one test from the tester via one or more high-speed serial interfaces while it is applying the previous test to the chips on the wafer at a slower rate, but with more parallelism.

Additionally, the interface test circuit and kerf structure could accept scanned test results directly from the chips-under-test. The interface test circuit contains the data-results buffer, or alternatively a compression method for compressing the data-results into a signature. This buffer or signature only need contain one copy of the test results or compression function with an expected signature. The scan outputs for all chips under-test, for each unique scan chain of the design, are compared prior to the test hip storing the results or compressing the results. The comparison verifies that all copies of a given scan chain are equal, and a failed comparison is considered a failed test. This comparison could be implemented on the interface test circuit, where the interface test circuit receives all scan outputs from all chips. Alternatively the comparison could be implemented in the kerf area for each unique scan chain of the design, such as with a ripple XOR compare function.

The approach also works for chips which include their own BIST The test bus can be used to initialize each chip, run the BIST and check the final signatures.

For wafers containing field programmable logic devices (FPLDs), one of the FPLDs themselves can be used as the test interface circuit thereby avoiding the necessity of adding unique interface circuits to the wafer.

Power distribution needs to consider that defectively shorted-out chips may prevent testing other chips that are connected to the same power source and provide means for disconnection of defectively shorted chips either by fuses or by large FET's controlled by the interface test circuit or by other means, such as using the chip enable input to shunt off the power coming into the chip.

Power can be provided by on chip means or by a probe contacting one or more chips on the wafer.

If, prior to dicing of the wafer, it is deemed necessary to remove the test wiring any of a number of different techniques known to the prior art may be used.

Shorted I/Os will either limit the yield (by preventing testing of all the chips on the same bus from the interface test circuit) or require some means of disconnect for example one could use an FET in series with each I/O with a common control line for the chip sources from the interface test circuit or alternately use a redundant line mechanism by supplying redundant bus lines from the interface test circuit with the muxing mechanism on each end to disconnect the chips under test from the shorted bus and reconnect them to the redundant line.

The use of multiple test buses as taught by the present invention minimizes the impact of faulty kerf wiring/logic. By connecting more than one interface test circuit to each test bus, one may bypass a defective interface test circuit. Preferably, each interface test circuit will have a pull-up or pull-down device that will disable that interface test circuit unless the pull-up or pull-down is actively overridden by the tester as it takes control of a specific interface test circuit. This approach prevents interface test circuits that are not currently being used from interfering with the active interface test circuit's use of the test buses.

The present invention thus teaches an improved arrangement of testing chips while still in wafer form while using a minimum number of tester interfaces or contacts by providing at least two communication paths coupling each such chip, on the wafer to at least two different tester interfaces. The present invention thus assures that each chip on the wafer can be positively and efficiently tested without including, in each chip to be tested, any portion of the required test logic. The present invention also substantially eliminates the probability that an interface or wiring defect can result in the rejection of good chips.

Figure 4:
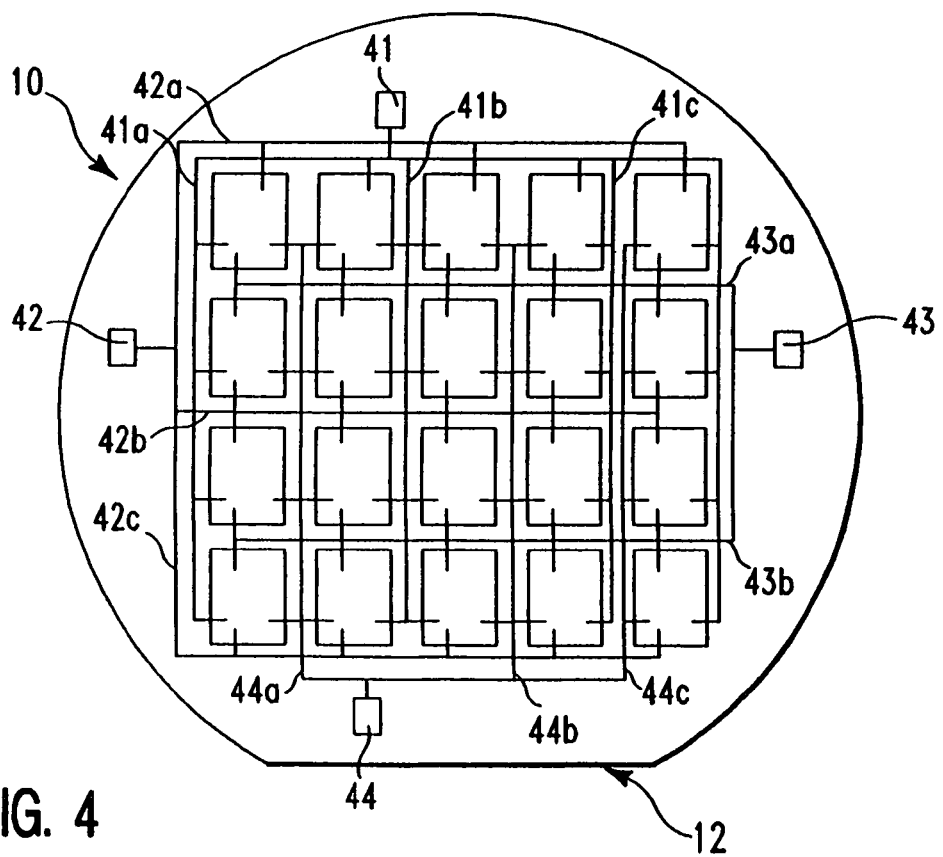
FIG. 4 shows a different embodiment wherein more than two tester interface test circuits are each coupled, via buses in the kerf, to every chip on the wafer of FIG. 1.

FIG. 4 shows a different embodiment wherein four tester interface test circuits are each coupled, via buses in the kerf, to the circuitry of every chip on the wafer of FIG. 1 thus providing even greater testing redundancy. More particularly, FIG. 4 shows a top view of the semiconductor wafer 10 of the present invention illustrating how, in accordance with the present invention, there is positioned, around the periphery of the wafer at four test interface circuits 41, 42, 43 and 44, each of which is connected, via respective wiring paths to the circuitry of each chip 14 on the wafer. Each wiring path is provided with a number of branches sufficient to permit each interface circuit to interface with each and every chip. Thus circuit 41 is provided with three wiring paths 41a, 41b and 41c, circuit 42 is provided with three wiring paths 42a, 42b and 42c, circuit 43 is provided with two wiring paths 43a and 43c, circuit 43 is provided with two wiring paths 43a and 43c and circuit 44 is provided with three wiring paths 44a, 44b and 44c. In this way each interface tester circuit can provide each chip on the wafer with test information. This assures that each chip can always be tested even if an interface circuit or a wiring path fails.

This completes the description of the preferred embodiment of the invention. Since changes may be made in the above construction without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A semiconductor wafer, comprising:
    a semiconductor substrate;
    a plurality of integrated circuit chips formed in said substrate;
    said plurality of integrated circuit chips being formed in said semiconductor substrate to create a plurality of rows separated one row from another by a respective row kerf there between and a plurality of columns separated one column row from another by a respective column kerf;
    first, second, third and fourth tester interface circuits formed on said substrate;
    said first and said second tester interface circuit being coupled to each of said integrated circuit chips formed in said semiconductor substrate through first and second respective wiring paths located in said row kerfs;
    said third and said fourth tester interface circuit being coupled to each of said integrated circuit chips formed in said semiconductor substrate through third and fourth respective wiring paths located in said column kerfs; and
    each of said wiring paths having a plurality of distinct stimulus busses in each respective kerf area for providing each integrated circuit chip coupled thereto with power, parallel serial scan data, clock, control, chip enable data enable signals; and an output means for obtaining the response of said integrated circuit chips to such inputs.

2. The semiconductor wafer of claim 1 wherein:
    each of said first, second, third and fourth interface circuits includes an administration circuit containing a built-in test engine that also serves as a test buffer and a last stage pipeline of a tester to allow a number of said integrated circuit chips on the wafer to be tested in parallel.

3. The semiconductor wafer of claim 1 wherein:
    each of said tester interface circuits further includes a stimulus buss having a plurality of signal paths therein, a clock line, a control signal line, a response chain and an enable chain: wherein:
    said stimulus buss in each wiring path being respectively coupled to each respective chip through a respective pass gate;
    said enable chain is coupled through a respective chip enable circuit and a respective data enable circuit to each respective integrated circuit chip;
    each respective chip enable circuit and each respective data enable circuit having an output coupled through a shift register having inputs from the pass gate and the chip output; and
    said output is fed through the shift register circuit into the response chain.

4. The semiconductor wafer of claim 2 wherein:
    each stimulus bus in each respective wiring path being respectively coupled to each respective integrated circuit chip through a respective pass gate and through said enable chain coupled through a respective chip enable circuit and a respective data enable circuit to each respective integrated circuit chip,
    each respective chip enable circuit and each data enable circuit having an output coupled through a shift register circuit provided with an input from the pass gate and the integrated circuit chip output; and
    said output is fed through the shift register circuit in to the response chain.

5. The semiconductor wafer of claim 4 wherein:
    each stimulus buss is designed to supply multiple parallel stimulus signals for sending parallel serial scan data in each integrated circuit chip on said wafer and the chip enable chain input on each integrated circuit chip is driven by a control scan chain in the test buss.

6. The semiconductor wafer of claim 5 wherein:
    the signals on said stimulus buss contains a unique scan bit for each integrated circuit chip connected to said buss.

7. The semiconductor wafer of claim 6 wherein:
    all of said integrated circuit chips connected to a respective test buss receives identical input control data and,
    there is provided means for keeping the outputs from each integrated circuit chip separate from the outputs of any other integrated circuit chip to allow determining which integrated circuit chip is good or bad.

8. The semiconductor wafer of claim 7 wherein:
    the integrated circuit chip outputs are captured by the shift register located within the Kerf.

* * * * *